(12) United States Patent
Blalock et al.

(10) Patent No.: US 7,183,220 B1
(45) Date of Patent: Feb. 27, 2007

(54) PLASMA ETCHING METHODS

(75) Inventors: Guy T. Blalock, Boise, ID (US); David S. Becker, Boise, ID (US); Kevin G. Donohoe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/677,478

(22) Filed: Oct. 2, 2000

Related U.S. Application Data

(63) Continuation of application No. 09/141,775, filed on Aug. 27, 1998, now Pat. No. 6,277,759.

(51) Int. Cl.
*H01L 21/302* (2006.01)

(52) U.S. Cl. .................. 438/714; 438/706; 438/710; 134/1.1

(58) Field of Classification Search ............... 438/706, 438/710, 712, 720, 723, 714; 156/345, 345.3, 156/345.35, 34; 134/1.1, 1.2
See application file for complete search history.

(56) References Cited

U.S. PATENT DOCUMENTS

| | | | |
|---|---|---|---|
| 4,513,021 A | | 4/1985 | Purdes et al. |
| 4,528,066 A | | 7/1985 | Merkling, Jr. et al. |
| 5,026,666 A | | 6/1991 | Hills et al. |
| 5,242,538 A | | 9/1993 | Hamrah et al. |
| 5,302,240 A | * | 4/1994 | Hori et al. .................. 438/719 |
| 5,310,454 A | | 5/1994 | Ohiwu |
| 5,356,478 A | | 10/1994 | Chen et al. |
| 5,431,778 A | * | 7/1995 | Dahm et al. ................ 438/694 |
| 5,445,712 A | * | 8/1995 | Yanagida .................... 156/345 |

(Continued)

OTHER PUBLICATIONS

Stanley Wolf and Richard Tauber, Silicon Processing for the VLSI Era, vol. 1, pp. 549, 1986.

(Continued)

*Primary Examiner*—Lan Vinh
(74) *Attorney, Agent, or Firm*—Wells St. John, P.S.

(57) ABSTRACT

A plasma etching method includes forming a polymer comprising carbon and a halogen over at least some internal surfaces of a plasma etch chamber. After forming the polymer, plasma etching is conducted using a gas which is effective to etch polymer from chamber internal surfaces. In one implementation, the gas has a hydrogen component effective to form a gaseous hydrogen halide from halogen liberated from the polymer. In one implementation, the gas comprises a carbon component effective to getter the halogen from the etched polymer. In another implementation, a plasma etching method includes positioning a semiconductor wafer on a wafer receiver within a plasma etch chamber. First plasma etching of material on the semiconductor wafer occurs with a gas comprising carbon and a halogen. A polymer comprising carbon and the halogen forms over at least some internal surfaces of the plasma etch chamber during the first plasma etching. After the first plasma etching and with the wafer on the wafer receiver, second plasma etching is conducted using a gas effective to etch polymer from chamber internal surfaces and getter halogen liberated from the polymer to restrict further etching of the material on the semiconductor wafer during the second plasma etching. The first and second plasma etchings are ideally conducted at subatmospheric pressure with the wafer remaining in situ on the receiver intermediate the first and second etchings, and with the chamber maintained at some subatmospheric pressure at all time intermediate the first and second plasma etchings.

78 Claims, 1 Drawing Sheet

U.S. PATENT DOCUMENTS

| | | | |
|---|---|---|---|
| 5,468,686 A | 11/1995 | Kawamoto | |
| 5,505,816 A * | 4/1996 | Barnes et al. | 438/695 |
| 5,514,247 A | 5/1996 | Shan et al. | |
| 5,565,036 A * | 10/1996 | Westendorp et al. | 118/723 MP |
| 5,593,540 A | 1/1997 | Tomita et al. | |
| 5,626,775 A | 5/1997 | Roberts et al. | |
| 5,644,153 A * | 7/1997 | Keller | 257/324 |
| 5,647,953 A * | 7/1997 | Williams et al. | 156/345 |
| 5,679,215 A | 10/1997 | Barnes et al. | |
| 5,681,424 A * | 10/1997 | Saito et al. | 156/345 |
| 5,716,494 A | 2/1998 | Imai et al. | |
| 5,756,400 A | 5/1998 | Ye et al. | |
| 5,767,021 A | 6/1998 | Imai et al. | |
| 5,780,338 A | 7/1998 | Jeng et al. | |
| 5,788,869 A | 8/1998 | Dalton et al. | |
| 5,798,303 A * | 8/1998 | Clampitt | 438/696 |
| 5,814,563 A * | 9/1998 | Ding et al. | 438/714 |
| 5,817,578 A | 10/1998 | Ogawa | |
| 5,830,279 A | 11/1998 | Hackenberg | |
| 5,843,226 A | 12/1998 | Zhao et al. | |
| 5,843,239 A | 12/1998 | Shrotriya | |
| 5,843,847 A | 12/1998 | Pu et al. | |
| 5,865,938 A | 2/1999 | Peeters et al. | |
| 5,868,853 A | 2/1999 | Chen et al. | |
| 5,873,948 A | 2/1999 | Kim | |
| 5,879,575 A | 3/1999 | Tepman et al. | |
| 5,935,340 A | 8/1999 | Xia et al. | |
| 5,965,463 A * | 10/1999 | Cui et al. | 438/723 |
| 6,093,655 A | 7/2000 | Donohoe et al. | |
| 6,103,070 A * | 8/2000 | Hong | 204/192.12 |
| 6,136,211 A * | 10/2000 | Qian et al. | 216/37 |
| 6,136,214 A * | 10/2000 | Mori et al. | 216/67 |
| 6,143,665 A | 11/2000 | Hsieh | |
| 6,200,412 B1 * | 3/2001 | Kilgore et al. | 156/345 |
| 6,235,213 B1 | 5/2001 | Allen, III | |
| 6,434,327 B1 | 8/2002 | Gronet et al. | |
| 6,465,051 B1 * | 10/2002 | Sahin et al. | 427/534 |
| 6,533,953 B2 | 3/2003 | Allen, III | |
| 6,800,561 B2 | 10/2004 | Allen, III | 438/714 |
| 6,878,300 B2 | 4/2005 | Allen, III | 216/58 |

OTHER PUBLICATIONS

Stanley Wolf and Richard Tauber. Silicon Processing for the VLSI Era. vol. 1, pp. 549, 1986.

U.S. Appl. No. 09/429880, filed Oct. 29, 1999, Donohoe et al.

* cited by examiner

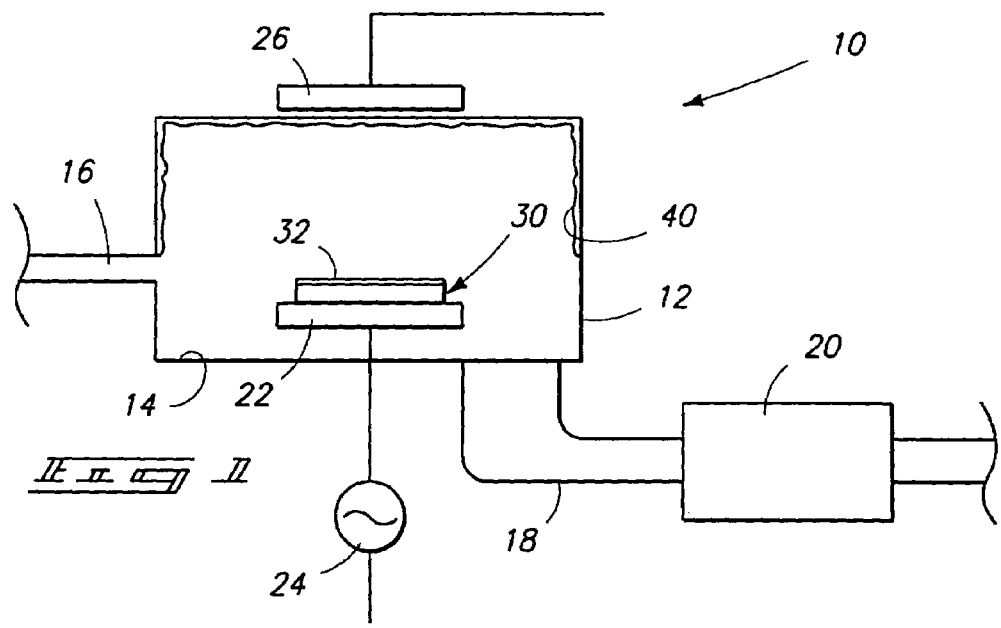
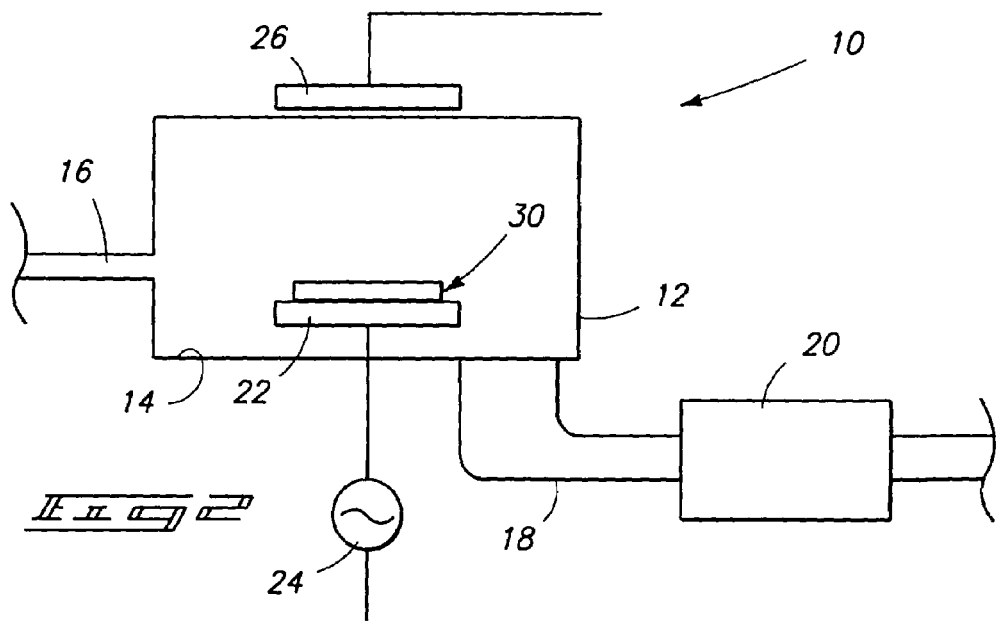

PLASMA ETCHING METHODS

RELATED PATENT DATA

This patent is a continuation application of U.S. patent application Ser. No. 09/141,775, which was filed on Aug. 27, 1998, entitled "Plasma Etching Methods", naming Guy T. Blalock, David S. Becker and Kevin G. Donohoe as inventors, and which is now U.S. Pat. No. 6,277,759, the disclosure of which is incorporated by reference.

TECHNICAL FIELD

This invention relates to plasma etching methods.

BACKGROUND OF THE INVENTION

Plasma etchers are commonly used in semiconductor wafer processing for fabrication of contact openings through insulating layers. A photoresist layer having contact opening patterns formed therethrough is typically formed over an insulative oxide layer, such as $SiO_2$ and doped $SiO_2$. An oxide etching gas, for example $CF_4$ is provided within the etcher and a plasma generated therefrom over the wafer or wafers being processed. The etching gas chemistry in combination with the plasma is ideally chosen to be highly selective to etch the insulating material through the photoresist openings in a highly anisotropic manner without appreciably etching the photoresist itself. A greater degree of anisotropy is typically obtained with such dry plasma etchings of contact openings than would otherwise occur with wet etching techniques.

One type of plasma etcher includes inductively coupled etching reactors. Such typically include an inductive plasma generating source coiled about or at the top of the reactor chamber and an electrostatic chuck within the chamber atop which one or more wafers being processed lies. The electrostatic chuck can be selectively biased as determined by the operator. Unfortunately when utilizing etching components having both carbon and fluorine, particularly in inductively coupled etching reactors, a halocarbon polymer develops over much of the internal reactor sidewall surfaces. This polymer continually grows in thickness with successive processing. Due to instabilities in the polymer film, the films are prone to flaking causing particulate contamination. In addition, the build-up of these films can produce process instabilities which are desirably avoided.

The typical prior art process for cleaning this polymer material from the reactor employs a plasma etch utilizing $O_2$ as the etching gas. It is desirable that this clean occur at the conclusion of etching of the wafer while the wafer or wafers remain in situ within the reactor chamber. This both protects the electrostatic chuck (which is sensitive to particulate contamination) during the clean etch, and also maximizes throughput of the wafers being processed. An added benefit is obtained in that the oxygen plasma generated during the clean also has the effect of stripping the photoresist from the over the previously etched wafer.

However in the process of doing this reactor clean etch, there is the contact. In other words, the contact openings within the insulating layer are effectively widened from the opening dimensions as initially formed. This results in an inherent increase in the critical dimension of the circuitry design. As contact openings become smaller, it is not expected that the photolithography processing will be able to adjust in further increments of size to compensate for this critical dimension loss.

Accordingly, it would be desirable to develop plasma etching methods which can be used to minimize critical dimension loss of contact openings, and/or achieve suitable reactor cleaning to remove the polymer from the internal surfaces of the etching chamber. Although the invention was motivated from this perspective, the artisan will appreciate other possible uses with the invention only be limited by the accompanying claims appropriately interpreted in accordance with the Doctrine of Equivalents.

BRIEF DESCRIPTION OF THE DRAWINGS

Preferred embodiments of the invention are described below with reference to the following accompanying drawings.

FIG. 1 is a diagrammatic view of a plasma etcher utilized at one processing step in accordance with the invention.

FIG. 2 is a view of the FIG. 1 apparatus and wafer at a processing step subsequent to that depicted by FIG. 1.

SUMMARY OF THE INVENTION

In but one aspect of the invention, a plasma etching method includes forming a polymer comprising carbon and a halogen over at least some internal surfaces of a plasma etch chamber. After forming the polymer, plasma etching is conducted using a gas which is effective to etch polymer from chamber internal surfaces. In one implementation, the gas has a hydrogen component effective to form a gaseous hydrogen halide from halogen liberated from the polymer. The hydrogen component is preferably one or more of $H_2$, $NH_3$ and $CH_4$. The conversion of the halogen, released from the clean into a hydrogen halide, renders it substantially ineffective in etching the substrate and thus reduces the critical dimension loss. In one implementation, the gas comprises a carbon component effective to getter the halogen from the etched polymer.

In another implementation, a plasma etching method includes positioning a semiconductor wafer on a wafer receiver within a plasma etch chamber. First plasma etching of material on the semiconductor wafer occurs with a gas comprising carbon and a halogen. A polymer comprising carbon and the halogen forms over at least some internal surfaces of the plasma etch chamber during the first plasma etching. After the first plasma etching and with the wafer on the wafer receiver, second plasma etching is conducted using a gas effective to etch polymer from chamber internal surfaces and getter halogen liberated from the polymer to restrict further etching of the material on the semiconductor wafer during the second plasma etching. The first and second plasma etchings are ideally conducted at subatmospheric pressure with the wafer remaining in situ on the receiver intermediate the first and second etchings, and with the chamber maintained at some subatmospheric pressure at all time intermediate the first and second plasma etchings.

The halogen preferably comprises fluorine, chlorine or mixtures thereof. The gas at least during the second etching preferably includes oxygen, such as $O_2$.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

It has been discovered that the polymer deposited on the internal walls of the etching chamber includes a significant concentration of fluorine. It is believed that the oxygen during the clean etching under plasma condition combines with the carbon and fluorine of the polymer liberated from the internal walls and forms carbon monoxide and carbon dioxide plus an activated or reactive fluorine species. Unfortunately, this liberated fluorine species is also apparently reactive with the silicon dioxide material on the wafer, which results in more etching of such material and the widening of the contact openings.

Referring to FIG. 1, a plasma etching reactor is indicated generally with reference numeral 10. Such includes sidewalls 12 having internal surfaces 14. One or more gas inlets 16 and one or more gas outlets 18 are provided relative to etching chamber 12. A pump 20 is associated with outlet 18 for exhausting and establishing desired subatmospheric pressure conditions within chamber 12 during processing.

Plasma etching reactor 10 in the described embodiment is configured as an inductively coupled plasma etcher having a wafer receiver 22 within chamber 12 in the form of an electrostatic chuck. A biasing source 24 is electrically coupled with receiver 22. An inductive plasma inducing source 26 is diagrammatically shown externally at the top of chamber 10.

In accordance with the preferred embodiment, a semiconductor wafer 30 is positioned upon wafer receiver 22 within chamber 12. Wafer 30 has previously been processed to have a photoresist layer 32 formed on an insulative oxide layer (not specifically shown) formed on the outer surface of wafer 30. Photoresist layer 32 has contact opening patterns (not specifically shown) formed therethrough which ideally outwardly expose selected portions of the underlying insulative oxide layer.

A desired vacuum pressure is established and maintained within chamber 12 utilizing vacuum pump 20. An example chamber pressure is from about 30 mTorr to about 5 Torr. Inductively coupled source 26 and chuck 22 are appropriately biased to enable establishment of a desired plasma within and immediately over wafer 30. An example power range for inductively coupled source 26 is from 100 watts to about 2,000 watts, with wafer receiver 22 being negatively biased to an example of 100–400 volts. Receiver 22 can have a temperature which is allowed to float, or otherwise be established and maintained at some range, for example from about −10° C. to about 40° C.

Desired etching gases are injected to within chamber 12 through inlet 16, or other inlets, to provide a desired etching gas from which an etching plasma is formed immediately over wafer 30. Such gas can comprise, for example, carbon and a halogen. An exemplary gas would be $CF_4$. Etching is conducted for a selected time to etch contact openings within the insulative oxide material on semiconductor wafer 30 through the contact opening patterns formed within photoresist layer 32. Unfortunately, a polymer layer 40 comprising carbon and the halogen, in this example fluorine, forms over some of internal surfaces 14 of plasma etch chamber 12 during such etching. Such polymer can also form over photoresist layer 32 (not specifically shown). Such provides but one example of forming a polymer comprising carbon and a halogen over at least some internal surfaces of a plasma etch chamber.

Referring to FIG. 2, and at the conclusion of the first plasma etching and with wafer 30 on electrostatic chuck 22, chuck 22 is ideally provided at ground or floating potential and second plasma etching conducted using a gas effective to etch polymer from chamber internal surfaces 14. The gas ideally has one or more components effective to etch photoresist layer 32 from substrate 30 and polymer from chamber internal surfaces 14 (both being shown as removed in FIG. 2). Further, such one or more components of the gas are selected to be effective to getter halogen liberated from the polymer to restrict further etching of the insulative oxide or other previously etched material on the semiconductor wafer during the second plasma etching.

In one example, the gettering component comprises hydrogen which combines with the halogen during the second plasma etching to form a gaseous hydrogen halide which has a low reactivity with material of the semiconductor wafer, and accordingly is withdrawn from the reactor through outlet 18. Example hydrogen atom containing gases include $NH_3$, $H_2$, and $CH_4$. One example gas for providing the hydrogen component to the chamber is forming gas which consists essentially of $N_2$ at about 96% or greater and $H_2$ at about 4% or less, by volume.

In another example, the gettering component comprises a carbon compound. Examples include hydrocarbons, aldehydes (i.e., formaldehyde) and ketones (i.e., methyl ketone). Hydrocarbons will typically getter the halogen as a hydrogen halide. Where the carbon compound comprises a C—O bond which survives the processing, the halogen will typically be gettered as $COA_x$, where A is the etched halogen. One example carbon containing gettering compound having a C—O bond is CO, produced for example within the plasma from injecting $CO_2$ to within the reactor.

The gas also ideally comprises an additional oxygen component, such as $O_2$ or other material. Such facilitates etching of both polymer and photoresist over the substrate. Where the gas components comprise $O_2$ and a hydrogen atom containing component, the $O_2$ component and hydrogen atom containing component are preferably provided in the chamber during the second plasma etching at a volumetric ratio of at least 0.1:1 of $O_2$ to the hydrogen atom containing component. One reduction to practice example in a thirty-five liter high density plasma etcher included a feed for the second plasma etching of 60 sccm $NH_3$ and 1,000 sccm per minute of $O_2$. For a carbon containing compound, such is preferably provided at from about 5% to about 80% by volume of the oxygen/carbon compound mixture.

Plasma conditions within the chamber with respect to pressure and temperature and biasing power on induction source 26 can be the same as in the first etching, or different. Regardless, such first and second plasma etchings are ideally conducted at subatmospheric pressure where the wafer remains in situ on the electrostatic chuck intermediate the first and second etchings with the chamber being maintained at some subatmospheric pressure at all time intermediate the first and second plasma etchings.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:
1. A plasma etching method comprising:
   etching a semiconductor wafer having a photoresist material thereon with a plasma etching material, the plasma etching material forming a polymer comprising carbon and a halogen over at least some internal surfaces of a plasma etch chamber;

after forming the polymer, plasma etching using a gas effective to etch polymer from chamber internal surfaces and photoresist from the semiconductor wafer; the gas having a hydrogen component effective to form a gaseous hydrogen halide from halogen liberated from the polymer; and wherein the gas comprises $O_2$, and wherein the hydrogen component and $O_2$ are provided in the chamber during the plasma etching at a volumetric ratio of the one to the another of at least 0.1:1 of $O_2$ to the hydrogen component.

2. The plasma etching method of claim 1 wherein the halogen is selected from the group consisting of fluorine, chlorine and mixtures thereof.

3. The plasma etching method of claim 1 wherein the halogen comprises fluorine.

4. The plasma etching method of claim 1 wherein the hydrogen component comprises $NH_3$.

5. The plasma etching method of claim 1 wherein the hydrogen component comprises $H_2$.

6. The plasma etching method of claim 1 wherein the $O_2$ is provided at a flow rate of 1000 sccm.

7. The plasma etching method of claim 1 wherein the hydrogen component comprises at least $H_2$ and $NH_3$.

8. The plasma etching method of claim 1 wherein the hydrogen component comprises at least $NH_3$ and $CH_4$.

9. The plasma etching method of claim 1 wherein the hydrogen component comprises $H_2$, $NH_3$ and $CH_4$.

10. The plasma etching method of claim 1 wherein the hydrogen component comprises $N_2$ at about 96% or greater and $H_2$ at about 4% or less, by volume.

11. The plasma etching method of claim 1 wherein the semiconductor wafer comprises silicon dioxide.

12. The plasma etching method of claim 1 wherein the plasma etching material comprises a different etchant chemistry relative to an etchant chemistry of the plasma etching using the gas to etch polymer.

13. A plasma etching method comprising:

etching a semiconductor wafer with a plasma etching material, the material forming a polymer comprising carbon and a halogen over at least some internal surfaces of a plasma etch chamber;

after forming the polymer, plasma etching at subatmospheric pressure using a gas effective to etch polymer from chamber internal surfaces; the gas comprising a carbon compound effective to getter the halogen from the etched polymer; and wherein the gas comprises an oxygen component forming an oxygen and carbon compound mixture, and wherein the carbon compound is provided at from about 5% to about 80% by volume of the oxygen and carbon compound mixture.

14. The plasma etching method of claim 13 wherein the gettering comprises forming a gaseous hydrogen halide from the etched halogen.

15. The plasma etching method of claim 13 wherein the gettering comprises forming a gaseous $COA_x$ compound, where A is the etched halogen.

16. The plasma etching method of claim 13 wherein the carbon compound comprises a hydrocarbon.

17. The plasma etching method of claim 13 wherein the carbon compound comprises a C—O bond.

18. The plasma etching method of claim 13 wherein the carbon compound comprises CO.

19. The plasma etching method of claim 13 wherein the carbon compound comprises CO formed from $CO_2$ injected into the chamber.

20. The plasma etching method of claim 13 wherein the halogen comprises fluorine.

21. The plasma etching method of claim 13 wherein the carbon compound comprises aldehyde.

22. The plasma etching method of claim 13 wherein the carbon compound comprises ketone.

23. The plasma etching method of claim 13 wherein the semiconductor wafer comprises silicon dioxide.

24. The plasma etching method of claim 13 wherein the plasma etching material comprises a different etchant chemistry relative to an etchant chemistry of the plasma etching at the subatmospheric pressure.

25. A plasma etching method comprising:

positioning a semiconductor wafer on a wafer receiver within a plasma etch chamber;

first plasma etching material on the semiconductor wafer with a gas comprising carbon and a halogen, a polymer comprising carbon and the halogen forming over at least some internal surfaces of the plasma etch chamber during the first plasma etching;

after the first plasma etching and with the wafer on the wafer receiver, second plasma etching at subatmospheric pressure using a gas effective to etch polymer from chamber internal surfaces and getter halogen liberated from the polymer to restrict further etching of the material on the semiconductor wafer during the second plasma etching, the gas comprising at least $H_2$ and $NH_3$; and wherein the second plasma etching is conducted with the receiver having a temperature which is allowed to float.

26. The plasma etching method of claim 25 wherein the receiver is biased during the first plasma etching and provided at ground or floating potential during the second plasma etching.

27. The plasma etching method of claim 25 wherein the gas comprises hydrogen which combines with the halogen during the second plasma etching to form a gaseous hydrogen halide.

28. The plasma etching method of claim 25 wherein the second etching is conducted at a chamber pressure of from about 30 mTorr to about 5 Torr.

29. The plasma etching method of claim 25 wherein the halogen comprises fluorine.

30. The plasma etching method of claim 25 wherein the gas comprises an oxygen component.

31. The plasma etching method of claim 25 wherein the gas comprises $NH_3$, with hydrogen from the $NH_3$ combining with the halogen during the second plasma etching to form a gaseous hydrogen halide.

32. The plasma etching method of claim 25 wherein the gas comprises $H_2$ which combines with the halogen during the second plasma etching to form a gaseous hydrogen halide.

33. The plasma etching method of claim 25 wherein the first and second plasma etchings are conducted at subatmospheric pressure, and the wafer remaining in situ on the receiver intermediate the first and second etchings, and maintaining the chamber at a subatmospheric pressure at all time intermediate the first and second plasma etchings.

34. The plasma etching method of claim 25 wherein the second plasma etching is conducted with the receiver having a temperature without maintaining the temperature within a controlled temperature range.

35. The plasma etching method of claim 25 wherein the gas effective to etch the polymer comprises $NH_3$ and $CH_4$.

36. The plasma etching method of claim 25 wherein the gas effective to etch the polymer comprises $H_2$, $NH_3$ and $CH_4$.

37. The plasma etching method of claim 25 wherein the gas effective to etch the polymer comprises $N_2$ at about 96% or greater and $H_2$ at about 4% or less, by volume.

38. The plasma etching method of claim 25 wherein the semiconductor wafer comprises silicon dioxide.

39. The plasma etching method of claim 25 wherein the first plasma etching comprises a different etchant chemistry relative to an etchant chemistry of the second plasma etching.

40. The plasma etching method of claim 25 wherein the gas comprises a carbon compound effective for the gettering.

41. The plasma etching method of claim 40 wherein the carbon compound comprises a hydrocarbon.

42. A plasma etching method comprising:
    positioning a semiconductor wafer on a wafer receiver within a plasma etch chamber, the semiconductor wafer having a photoresist layer formed thereon;
    negatively biasing the wafer receiver to a range of 100 to 400 volts;
    first plasma etching material on the semiconductor wafer through openings formed in the photoresist layer with a gas comprising carbon and a halogen, a polymer comprising carbon and the halogen forming over at least some internal surfaces of the plasma etch chamber during the first plasma etching; and
    after the first plasma etching and with the wafer on the wafer receiver, second plasma etching at subatmospheric pressure using a gas having one or more components effective to etch photoresist from the wafer and polymer from chamber internal surfaces and getter halogen liberated from the polymer to restrict further etching of the material on the semiconductor wafer during the second plasma etching, the gas having the one or more components comprising at least $H_2$ and $CH_4$.

43. The plasma etching method of claim 42 wherein one of the gas components comprises hydrogen which combines with the halogen during the second plasma etching to form a gaseous hydrogen halide.

44. The plasma etching method of claim 42 wherein one of the gas components comprises $O_2$ and another is hydrogen atom containing.

45. The plasma etching method of claim 42 wherein one of the gas components comprises $O_2$ and another is hydrogen atom containing, said one component and said another component being provided in the chamber during the second plasma etching at a volumetric ratio of the one to the another of at least 0.1:1 of $O_2$ to the hydrogen component.

46. The plasma etching method of claim 42 wherein the halogen comprises fluorine.

47. The plasma etching method of claim 42 wherein one of the gas components comprises $NH_3$, with hydrogen from the $NH_3$ combining with the halogen during the second plasma etching to form a gaseous hydrogen halide.

48. The plasma etching method of claim 42 wherein one of the gas components comprises $H_2$ which combines with the halogen during the second plasma etching to form a gaseous hydrogen halide.

49. The plasma etching method of claim 42 wherein the first and second plasma etchings are conducted at subatmospheric pressure, and the wafer remaining in situ on the receiver intermediate the first and second etchings, and maintaining the chamber at a subatmospheric pressure at all time intermediate the first and second plasma etchings.

50. The plasma etching method of claim 42 wherein the gas comprises a carbon compound effective for the gettering.

51. The plasma etching method of claim 42 wherein the gas having the one or more components comprises $H_2$ and $NH_3$.

52. The plasma etching method of claim 42 wherein the gas having the one or more components comprises $NH_3$ and $CH_4$.

53. The plasma etching method of claim 42 wherein the gas having the one or more components comprises $N_2$ at about 96% or greater and $H_2$ at about 4% or less, by volume.

54. The plasma etching method of claim 42 wherein the semiconductor wafer comprises silicon dioxide.

55. A plasma etching method comprising:
    positioning a semiconductor wafer on an electrostatic chuck within an inductively coupled plasma etch chamber, the semiconductor wafer having a photoresist layer formed on an insulative oxide layer, the photoresist layer having contact opening patterns formed therethrough;
    first plasma etching contact openings within the insulative oxide on the semiconductor wafer through the contact opening patterns formed in the photoresist layer with a gas comprising carbon and fluorine, a polymer comprising carbon and fluorine forming over at least some internal surfaces of the plasma etch chamber during the first plasma etching; and
    after the first plasma etching and with the wafer on the electrostatic chuck, providing the electrostatic chuck at ground or floating potential while second plasma etching at subatmospheric pressure using a gas comprising an oxygen component and a hydrogen component effective to etch photoresist from the wafer and polymer from chamber internal surfaces, and forming HF during the second plasma etching from fluorine liberated from the polymer to restrict widening of the contact openings formed in the insulative oxide resulting from further etching of the material on the semiconductor wafer during the second plasma etching, the hydrogen component comprising at least a hydrocarbon and $NH_3$.

56. The plasma etching method of claim 42 wherein the first plasma etching comprises a different etchant chemistry relative to an etchant chemistry of the second plasma etching.

57. The plasma etching method of claim 55 wherein the oxygen comprises $O_2$.

58. The plasma etching method of claim 55 wherein the hydrogen component comprises $H_2$.

59. The plasma etching method of claim 55 wherein the first and second plasma etchings are conducted at subatmospheric pressure, and the wafer remaining in situ on the electrostatic chuck intermediate the first and second etchings, and maintaining the chamber at a subatmospheric pressure at all time intermediate the first and second plasma etchings.

60. The plasma etching method of claim 55 wherein the hydrogen component comprises $CH_4$.

61. The plasma etching method of claim 55 wherein the hydrogen component comprises $H_2$ and $CH_4$.

62. The plasma etching method of claim 55 wherein the hydrogen component comprises $N_2$ at about 96% or greater and $H_2$ at about 4% or less, by volume.

63. The plasma etching method of claim 55 wherein the semiconductor wafer comprises silicon dioxide.

64. The plasma etching method of claim 55 wherein the first plasma etching comprises a different etchant chemistry relative to an etchant chemistry of the second plasma etching.

65. The plasma etching method of claim 55 wherein the oxygen comprises $O_2$, and wherein the $O_2$ is provided at a flow rate of 1000 sccm.

66. A plasma etching method comprising:

positioning a semiconductor wafer on an electrostatic chuck within an inductively coupled plasma etch chamber, the semiconductor wafer having a photoresist layer formed on an insulative oxide layer, the photoresist layer having contact opening patterns formed therethrough;

first plasma etching contact openings within the insulative oxide on the semiconductor wafer through the contact opening patterns formed in the photoresist layer with a gas comprising carbon and fluorine, a polymer comprising carbon and fluorine forming over at least some internal surfaces of the plasma etch chamber during the first plasma etching; and after the first plasma etching and with the wafer on the electrostatic chuck, providing the electrostatic chuck at ground or floating potential while second plasma etching at subatmospheric pressure using a gas comprising an oxygen component and a carbon component effective to etch photoresist from the wafer and polymer from chamber internal surfaces, and gettering fluorine liberated from the polymer during the second plasma etching with the carbon component to restrict widening of the contact openings formed in the insulative oxide resulting from further etching of the material on the semiconductor wafer during the second plasma etching.

67. The plasma etching method of claim 66 wherein the gettering comprises forming a gaseous hydrogen halide from the etched halogen.

68. The plasma etching method of claim 66 wherein the gettering comprises forming a gaseous $COA_x$ compound, where A is the etched halogen.

69. The plasma etching method of claim 66 wherein the carbon compound comprises a C—O bond.

70. The plasma etching method of claim 66 wherein the carbon component comprises aldehyde.

71. The plasma etching method of claim 66 wherein the carbon component comprises ketone.

72. The plasma etching method of claim 66 wherein the semiconductor wafer comprises silicon dioxide.

73. The plasma etching method of claim 66 wherein the first plasma etching comprises a different etchant chemistry relative to an etchant chemistry of the second plasma etching.

74. A plasma etching method comprising:

positioning a semiconductor wafer on an electrostatic chuck within an inductively coupled plasma etch chamber, the semiconductor wafer having a photoresist layer formed on an insulative oxide layer, the photoresist layer having contact opening patterns formed therethrough;

first plasma etching contact openings within the insulative oxide on the semiconductor wafer through the contact opening patterns formed in the photoresist layer with a gas comprising carbon and fluorine, a polymer comprising carbon and fluorine forming over at least some internal surfaces of the plasma etch chamber during the first plasma etching; and after the first plasma etching and with the wafer on the electrostatic chuck, second plasma etching at subatmospheric pressure using a gas comprising $O_2$, a carbon component and $NH_3$ effective to etch photoresist from the wafer and polymer from chamber internal surfaces, and gettering fluorine liberated from the polymer during the second plasma etching with the carbon component to restrict widening of the contact openings formed in the insulative oxide resulting from further etching of the material on the semiconductor wafer during the second plasma etching, providing the $O_2$ and $NH_3$ in the plasma etch chamber at 1,000 sccm and 60 sccm, respectively.

75. The plasma etching method of claim 74 wherein the gas comprising the $O_2$, the carbon component and the $NH_3$ further comprises $H_2$.

76. The plasma etching method of claim 74 wherein the carbon component comprises $CH_4$.

77. The plasma etching method of claim 74 wherein the semiconductor wafer comprises silicon dioxide.

78. The plasma etching method of claim 74 wherein the first plasma etching comprises a different etchant chemistry relative to an etchant chemistry of the second plasma etching.

* * * * *

UNITED STATES PATENT AND TRADEMARK OFFICE
CERTIFICATE OF CORRECTION

PATENT NO. : 7,183,220 B1
APPLICATION NO. : 09/677478
DATED : February 27, 2007
INVENTOR(S) : Guy T. Blalock, David S. Becker and Kevin G. Donohoe It is certified that error appears in the above-identified patent and that said Letters Patent is hereby corrected as shown below:

Column 1, BACKGROUND OF THE INVENTION, line 57
Please replace "the photoresist from the"
With -- the photoresist from --

Column 1, BACKGROUND OF THE INVENTION, line 60
Please replace "there is the contact."
With -- there is an approximate 0.025 micron or greater loss in the lateral direction of the contact. --

Column 2, BACKGROUND OF THE INVENTION, line 7
Please replace "the invention only be limited by the"
With -- the invention only being limited by the --

Column 3, line 66
Please replace "etching conducted"
With -- etching is conducted --

Signed and Sealed this

Sixteenth Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,183,220 B1  Page 1 of 1
APPLICATION NO. : 09/677478
DATED : February 27, 2007
INVENTOR(S) : Guy T. Blalock, David S. Becker and Kevin G. Donohoe It is certified that error appears in the above-identified patent and that said Letters Patent is hereby corrected as shown below:

Title Page, Item (56) References Cited –

Please insert the following under U.S. Patent Documents:

| | | |
|---|---|---|
| --5,814,888 | 09/1998 | Nishioka et al. |
| 5,872,061 | 02/1999 | Lee et al. |
| 5,933,759 | 08/1999 | Nguyen et al. |
| 5,968,844 | 10/1999 | Keller |
| 6,010,967 | 10/2000 | Donohoe et al. |
| 6,127,278 | 10/2000 | Wang et al. |
| 6,258,728 B1 | 07/2001 | Donohoe et al. |
| 6,478,978 B1 | 11/2002 | Allen, III |
| 6,479,393 B1 | 11/2002 | Allen, III-- |

Signed and Sealed this

Eleventh Day of November, 2008

JON W. DUDAS
*Director of the United States Patent and Trademark Office*